(12) United States Patent
Aziz et al.

(10) Patent No.: US 6,765,348 B2
(45) Date of Patent: Jul. 20, 2004

(54) ELECTROLUMINESCENT DEVICES CONTAINING THERMAL PROTECTIVE LAYERS

(75) Inventors: Hany Aziz, Burlington (CA); Zoran D. Popovic, Mississauga (CA); Nan-Xing Hu, Oakville (CA)

(73) Assignee: Xerox Corporation, Stamford, CT (US)

( * ) Notice: Subject to any disclaimer, the term of this patent is extended or adjusted under 35 U.S.C. 154(b) by 485 days.

(21) Appl. No.: 09/770,154

(22) Filed: Jan. 26, 2001

(65) Prior Publication Data

US 2002/0145380 A1 Oct. 10, 2002

(51) Int. Cl.⁷ .................................................. H01J 1/62
(52) U.S. Cl. ...................................................... 313/504
(58) Field of Search ........................................ 313/504

(56) References Cited

U.S. PATENT DOCUMENTS

| | | | |
|---|---|---|---|
| 3,172,862 A | 3/1965 | Gurnee et al. | 252/301.3 |
| 3,530,325 A | 9/1970 | Mehl et al. | 313/108 |
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 4,885,211 A | 12/1989 | Tang et al. | 428/457 |
| 5,141,671 A | 8/1992 | Bryan et al. | 252/301.16 |
| 5,150,006 A | 9/1992 | Van Slyke et al. | 313/504 |
| 5,151,629 A | 9/1992 | VanSlyke | 313/504 |
| 5,227,252 A | 7/1993 | Murayama et al. | 428/690 |
| 5,229,628 A * | 7/1993 | Kobayashi et al. | 257/103 |
| 5,247,190 A | 9/1993 | Friend et al. | 257/40 |
| 5,276,381 A | 1/1994 | Wakimoto et al. | 313/504 |
| 5,429,884 A | 7/1995 | Namiki et al. | 428/690 |
| 5,516,577 A | 5/1996 | Matsuura et al. | 428/212 |
| 5,593,788 A | 1/1997 | Shi et al. | 428/690 |
| 5,601,903 A | 2/1997 | Fujii et al. | 428/212 |
| 5,602,445 A * | 2/1997 | Solanki et al. | 313/503 |
| 5,703,436 A | 12/1997 | Forrest et al. | 313/506 |
| 5,714,838 A * | 2/1998 | Haight et al. | 313/506 |
| 5,728,801 A | 3/1998 | Wu et al. | 528/422 |
| 5,846,666 A | 12/1998 | Hu et al. | 428/690 |
| 5,935,720 A | 8/1999 | Chen et al. | 428/690 |
| 5,942,340 A | 8/1999 | Hu et al. | 428/690 |
| 5,952,115 A | 9/1999 | Hu et al. | 428/690 |
| 6,057,048 A | 5/2000 | Hu et al. | 428/690 |
| 6,117,529 A * | 9/2000 | Leising et al. | 428/209 |
| 6,266,074 B1 * | 7/2001 | Koumura et al. | 347/133 |

* cited by examiner

Primary Examiner—Max Noori
(74) Attorney, Agent, or Firm—E. O. Palazzo

(57) ABSTRACT

The disclosure provided relates to an organic light emitting device containing
a substrate;
a first electrode;
a light emitting region comprising an organic luminescent material;
a second electrode, and a protective thermal layer or thermal layers, and which layer is contained on the first electrode, the second electrode, the first and second electrode, and/or is contained on other layers in the device.

36 Claims, 2 Drawing Sheets

ELECTROLUMINESCENT DEVICES CONTAINING THERMAL PROTECTIVE LAYERS

COPENDING APPLICATIONS

Illustrated in copending applications U.S. Ser. No. 09/770,159, filed concurrently herewith, the disclosure of which is totally incorporated herein by reference, is an organic light emitting device, comprising in an optional sequence (i) a substrate;
(ii) a first electrode;
(iii) a mixed region comprising a mixture of a hole transport material and an electron transport material, and wherein this mixed region includes at least one organic luminescent material;
(iv) a second electrode;
(v) a thermal protective element coated on the second electrode; wherein one of the two said electrodes is a hole injection anode, and one of the two said electrodes is an electron injection cathode, and wherein the organic light emitting device further comprises;
(vi) a hole transport region, interposed between the anode and the mixed region, wherein the hole transport region optionally includes a buffer layer; and
(vii) an electron transport region interposed between the second electrode and the mixed region; and U.S. Pat. No. 6,479,172, the disclosure of which is totally incorporated herein by reference, is an electroluminescent device comprised of a first electrode, an organic electroluminescent element, and a second electrode wherein said electroluminescent element contains a fluorescent hydrocarbon component of Formula (I)

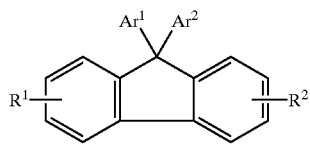

(I)

wherein $R^1$ and $R^2$ are substituents selected from the group consisting of hydrogen, an alkyl, an alicyclic alkyl, an alkoxy, a halogen, and a cyano; $Ar^1$ and $Ar^2$ are each independently an aromatic component or an aryl group comprised of a from about 4 to about 15 conjugate-bonded or fused benzene rings.

The mixed region, the hole transport region including the buffer layer, and the electron transport region reduce changes in device luminance and/or driving voltage during device operation, and enable stability in the device luminance and/or driving voltage during device operation for extended periods of time at elevated temperatures, while the thermal protective coating increases the device resistance to shorting at elevated temperatures, and thus improves the thermal durability of the organic EL device.

Illustrated in U.S. Pat. No. 6,492,339 on "Organic Light Emitting Devices Having Improved Efficiency and Operation Lifetime", filed on Jul. 20, 1999, and U.S. Pat. No. 6,392,250 on "Organic Light Emitting Devices Having Improved Performance", filed on Jun. 30, 2000, the disclosures of which are totally incorporated herein by reference, are organic light emitting devices (organic EL devices) that, for example, comprise a mixed region including a mixture of a hole transport material and an electron transport material. At least one of a hole transport material region and an electron transport material region can be formed on the mixed region. The stability of the above mentioned organic EL devices disclosed in U.S. Pat. No. 6,392,339 and U.S. Pat. No. 6,392,250 is usually reduced at temperatures above 80° C. due, it is believed, to a decrease in the device resistance to shorting and also since, it is believed, to a progressive increase in the driving voltage required to drive a certain current through the organic EL devices. As a result, the operational stability of these devices can be limited to a few hundred hours or less at these high temperatures, and more specifically, at high temperatures in the range of from about 80° C. to about 100° C. Therefore, these devices are believed to be unsatisfactory in some instances, for applications in which there is desired an operational stability of the organic EL device of at least, for example, several thousand hours at temperatures of, for example, 90° C., such as, for example, in some automotive, military or other industrial applications where durability in harsh conditions is necessary.

Also, illustrated in copending U.S. Ser. No. 09/629,163 (D/A0057) on "Annealed Organic Light Emitting Devices And Methods Of Annealing Organic Light Emitting Devices", filed Jul. 31, 2000, the disclosure of which is totally incorporated herein by reference, is a thermal annealing method and also annealed organic light emitting devices wherein the device performance is improved by means of thermal annealing.

The appropriate components and processes of the above copending applications may be selected for embodiments of the present invention.

BACKGROUND OF THE INVENTION

This invention relates to optoelectronic devices and, more particularly, to organic light emitting, or organic electroluminescent (EL) devices. More specifically, the present invention relates to stable organic EL devices, and which devices do not substantially degrade, or possess minimum degradation at, for example, high temperatures, such as 100° C., and moreover devices which are not substantially adversely affected by high temperatures. The organic EL devices according to the present invention can be used for various applications, and are especially useful in high temperature technological applications that usually require operating, storing, and/or heating the organic EL device at temperatures above 25° C., and more specifically, at temperatures in the range of about 60° C. to about 100° C.

PRIOR ART

Tang and Van Slyke disclose electroluminescent devices, reference C. W. Tang and S. A. Van Slyke, "Organic Electroluminescent Diodes," *Appl. Phys. Lett.* 51, pp. 913–915, 1987. Since this publication, organic light emitting devices (OLEDs) have attracted attention because of their potential for use in the fabrication of large-area displays, reference J. R. Sheats et al, "Organic Electroluminescent Devices," *Science* 273, pp. 884–888, 1996; J. Salbeck, "Electroluminescence with Organic Compounds," *Ber. Bunsenges. Phys. Chem.* 100, pp. 1667–1677, 1996; and Z. Shen et al., "Three-Color, Tunable, Organic Light-Emitting Devices," *Science* 276, pp. 2009–2011,1997.

In general, the structure of an EL device 10 is illustrated in FIG. 1. The EL device 10 includes a substrate 12 composed of, for example, glass; a first electrode 14 on the substrate 12; a second electrode 16; and interposed between the first electrode 14 and the second electrode 16 a light emitting region 18 formed of at least one layer comprising an organic luminescent material, such as, for example, a metal oxinoid compound, a stilbene compound, an anthracite compound, a polyfluorene, or a poly(p-phenylenevinylene). One of the electrodes includes a layer comprising at least one material with a high work (typically >4.0 eV), such as, for example, indium tin oxide (ITO) and functions as an anode, whereas the other electrode includes a layer comprising at least one material with a low work function (typically <4 eV), which can be a metal (such as, for example, Ca or Al), a metal alloy (such as, for example, Mg:Ag or Al:Li) or a metal compound (such as, for example, an alkaline metal halides or oxides), and which functions as a cathode. During operation, an applied electric field causes positive charges (holes) to be injected from the anode, and negative charges (electrons) to be injected from the cathode to recombine in the light emitting region 18 and thereby produce light emission.

A problem common to this type of known organic EL devices is poor thermal stability which usually renders the EL device unsuitable for technological applications that require high durability of devices at high temperatures, and which temperatures are, for example, above about 60° C., and specifically, temperatures in the range of about 70° C. to about 100° C. At these high temperatures, device shorting often occurs leading to high leakage currents, thus rendering the organic EL devices nonfunctional (reference, for example, Zhou et al., "Real-time observation of temperature rise and thermal breakdown processes in organic LEDs using an IR imaging and analysis system", *Advanced Materials* 12, pp 265–269, 2000).

Therefore, there is a need to prevent or, at least, to significantly reduce, or minimize the likelihood of the aforementioned prior art shorting of the organic EL device. This advantage is achievable with the organic EL devices of the present invention in embodiments thereof.

An organic EL device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of prior art organic EL devices have been prepared from a laminate of an organic luminescent material and electrodes of opposite polarity, which devices include a single crystal material, such as single crystal anthracene, as the luminescent substance as described, for example, in U.S. Pat. No. 3,530,325. However, these devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507 and 4,720,432, wherein U.S. Pat. No. 4,720,432 discloses, for example, an organic EL device comprising a dual-layer hole injecting and transporting zone, one layer being comprised of porphyrinic compounds supporting hole injection, and the other layer being comprised of aromatic tertiary amine compounds supporting hole transport. Another alternate device configuration illustrated in this patent is comprised of three separate layers, a hole transport layer, a luminescent layer, and an electron transport layer, which layers are laminated in sequence and are sandwiched between an anode and a cathode. Optionally, a fluorescent dopant material can be added to the emission zone or layer whereby the recombination of charges results in the excitation of the fluorescent.

There have also been attempts to obtain electroluminescence from organic light emitting devices containing mixed layers, for example, layers in which both the hole transport material and the emitting electron transport material are mixed together in one single layer, see, for example, J. Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities," *IEEE Transactions on Electron Devices* 44, pp. 1269–1281, 1997. In a number of such structures, the electron transport material and the emitting material are the same. However, as described in the S. Naka et al. article, these single mixed layer organic light emitting devices are generally less efficient than multi-layer organic light emitting devices. Recent EL research results indicate that those devices including only a single mixed layer of a hole transport material (composed of NBP, a naphthyl-substituted benzidine derivative) and an emitting electron transport material (composed of $Alq_3$, tris(8-hydroxyquinoline) aluminum) are inherently believed to be unstable. The instability of these devices is believed to be caused by the direct contact between the electron transport material in the mixed layer and the hole injecting contact comprised of indium tin oxide (ITO), which results in the formation of the unstable cationic electronic transport material, and the instability of the mixed layer/cathode interface, see, H. Aziz et al., *Science* 283, 1900 (1999), the disclosure of which is totally incorporated herein by reference in its entirety.

Also, there have been attempts to obtain electroluminescence from organic light emitting devices by introducing a hole transport material and an emitting electron transport material as dopants in an inert host material, as reported in the above-described article by J. Kido et al. However, such known devices have been found to be generally less efficient than conventional devices including separate layers of hole transport material and emitting electron transport material.

While recent progress in organic EL research has perhaps elevated the potential of organic EL devices, the operational stability of current available devices may still be below expectations. A number of known organic light emitting devices have relatively short operational lifetimes before their luminance drops to some percentage of its initial value. Although known methods of providing interface layers as described, for example, in S. A. Van Slyke et al., "Organic Electroluminescent Devices with Improved Stability," *Appl. Phys. Lett.* 69, pp. 2160–2162, 1996, and doping, as described in, for example, Y. Hamada et al., "Influence of the Emission Site on the Running Durability of Organic Electroluminescent Devices", *Jpn. J. Appl. Phys.* 34, pp. L824–L826, 1995, may perhaps increase the operational lifetime of organic light emitting devices for room temperature operation, the effectiveness these organic light emitting devices deteriorates dramatically for high temperature device operation. In general, device lifetime is reduced by a factor of about two for each 10° C. increment in the operational temperature. Moreover, at these high temperatures, the susceptibility of the organic light emitting devices is increased as described, for example, in Zhou et al., "Real-time observation of temperature rise and thermal breakdown processes in organic LEDs using an IR imaging and analysis system", *Advanced Materials* 12, pp 265–269, 2000, which further reduces the stability of the devices. As a result, the operational lifetime of known organic light emitting devices at a normal display luminance level of about 100 cd/m$^2$ is limited, for example, to about a hundred hours or less at temperatures in the range of about 60° C. to about 80° C., reference J. R. Sheats et al, "Organic Electroluminescent Devices," *Science* 273, pp. 884–888, 1996, and also S. Tokito et al., "High-Temperature Operation of an Electroluminescent Device Fabricated Using a Novel Triphenlamine Derivative," *Appl. Phys. Lett.* 69, 878 (1996).

SUMMARY AND EMBODIMENTS OF THE INVENTION

The present invention in embodiments overcomes or minimizes the above disadvantages of a number of known organic EL devices, which disadvantages primarily relate to device shorting at high temperatures, and which embodiments provide organic EL devices with enhanced stability at these temperatures. High temperature refers, for example, to above 60° C., and specifically in the range of about 70° C. to about 100° C., or higher, such as, for example 120° C. The present invention also embodies an organic EL device that contains at least one thermal protective element, for example up to four elements, and preferably one or two, wherein the thermal protective element is comprised of a single layer or a plurality of stacked layers laminated in contact to each other, and typically up to three layers. The thermal protective element(s) can be laminated in between or on top the other components (layers) of the organic light emitting device. The thermal protective element(s), for example, increase(s) the device resistance to shorting at elevated temperatures, and thus improves the thermal stability thereof.

Aspects of the present invention relate to an organic light emitting device comprising in sequence a substrate;

a first electrode;

a light emitting region comprising an organic luminescent material; and a second electrode; an organic light emitting device wherein one of the first electrode and second electrode serves as an anode, and one of the first electrode and second electrode serves as a cathode, and at least one thermal protective element; an organic light emitting device wherein the thermal expansion coefficient of the thermal protective layer is from about 1×10$^{-10}$ meter/meter per degree Centigrade to about 9×10$^{-6}$ meter/meter per degree Centigrade, and wherein one of the first electrode and second electrode serves as an anode, and one of the first electrode and second electrode serves as a cathode, and wherein at least one thermal protective element is from about 1 to about 4 layers; an organic light emitting device wherein the thermal expansion coefficient of the thermal protective element or layer is from about 1×10$^{-10}$ meter/meter per degree Centigrade to about 4×10$^{-6}$ meter/meter per degree Centigrade, and wherein one of the first electrode and second electrode serves as an anode, and one of the first electrode and second electrode serves as a cathode, and wherein at least one thermal protective element is a single layer; an organic light emitting device wherein the thermal protective element or layer is situated on the first electrode, on the second electrode and/or on the light emitting region comprising an organic luminescent material, and wherein one of the first electrode and second electrode serves as an anode, and one of the first electrode and second electrode serves as a cathode; an organic light emitting device wherein the thermal protective element is formed of a plurality of adjacent thermal protective layers, and wherein the individual thermal protective layers are comprised of similar or different materials; an organic light emitting device wherein the thickness of the thermal protective element is from about 10 nanometers to about 100,000 nanometers, and wherein one of the first electrode and second electrode serves as an anode, and one of the first electrode and second electrode serves as a cathode; t an he organic light emitting device wherein the thickness of the thermal protective element is from about 1 nanometer to about 10 nanometers, and wherein one of the first electrode and second electrode serves as an anode, and one of the first electrode and second electrode serves as a cathode; the organic light emitting device wherein the thickness of each of the individual thermal layers is from about 1 nanometer to about 2,000 nanometers; an organic light emitting device wherein there is from about 2 to about 4 thermal protective elements or layers; an organic light emitting device wherein the thermal protective element, layer, or layers is comprised of the same or different materials; an organic light emitting device wherein the thermal protective element, layer, or layers is coated on the second electrode; an organic light emitting device wherein the thermal protective element is comprised of a material selected from the group consisting of organic compounds, inorganic compounds, metals, metal alloys, and mixtures thereof; and optionally wherein the thermal expansion coefficient of this material is from about 1×10$^{-10}$ meter/meter per degree Centigrade to about 9×10$^{-6}$ meter/meter per degree Centigrade; an organic light emitting device wherein the organic compound is copper phthalocyanine; an organic light emitting device wherein the inorganic compound is a metal compound selected from the group consisting of metal oxides, metal halides, metal carbides and metal nitrides; an organic light emitting device wherein the metal oxide is selected from the group consisting of MgO, Al$_2$O$_3$, BeO, BaO, AgO, SrO, SiO, SiO$_2$, ZrO$_2$, CaO, Cs$_2$O, Rb$_2$O, Li$_2$O, K$_2$O and Na$_2$O; and the metal halide is selected from the group consisting of LiF, KCl, NaCl, CsCl, CsF and KF; an organic light emitting device wherein the metal compound is a silicon compound; an organic light emitting device wherein the silicon compound is SiO, or SiO$_2$; an organic light emitting device wherein the metal is selected from the group consisting of Cr, Ti, Si, Ir, Pt, Os, V, Mo, Si, Zr, Ta, W, and Sb; and wherein the metal alloy is selected from the group consisting of Ni, Fe, Cr, Ti, Si, Ir, Pt, Os, V, Mo, Si, Zr, Ta, W, and Sb alloys; an organic light emitting device wherein the thermal protective element is comprised of a carbon compound; the organic light emitting device wherein the light emitting region comprises a hole transport region adjacent to the first electrode and which region is comprised of a hole transport material, and an electron transport region adjacent to the second electrode and comprised of an electron transport material, and wherein at least one of the hole transport region and the electron transport region emits light, and wherein one of the first electrode and second electrode serves as an anode, and one of the first electrode and second electrode serves as a cathode, and at least one thermal protective element situated on the cathode, the anode, or the cathode and the anode; an organic light emitting device wherein the light emitting region comprises a hole transport region adjacent to the first electrode and which electrode is an anode, and which region is comprised of a hole transport material; an electron transport region adjacent to the second electrode and which electrode is a cathode, and which electron transport is comprised of an electron transport material and the light emitting layer situated in between the hole transport region and a electron transport region comprised of an organic luminescent material, and further including a protective thermal element coated on the anode, the cathode, or the anode and the cathode; an organic light emitting device wherein the light emission region comprises a mixed region comprising a mixture of a hole transport material and an electron transport material, and wherein one of the first electrode and second electrode serves as an anode, and one of the first electrode and second electrode serves as a cathode, and further including at least one thermal protective element; an organic light emitting device wherein the light emission region comprises a mixed region comprising a mixture of a hole transport material and an electron transport material; and the light emitting region further comprises at least one of (i) a hole transport region interposed between the first electrode and the mixed region; and (ii) an electron transport region interposed between the second electrode and the mixed region, and wherein at least one of the hole transport region, the electron transport region and the mixed region emits light, and wherein one of the first electrode and second electrode serves as an anode, and one of the first electrode and second electrode serves as a cathode, and further including at least one thermal protective element coated on the anode or the cathode; an organic light emitting device wherein the light emission region comprises a component selected from the group consisting of polyphenylenes, polyphenylvinylenes, polyfluorenes, polypyrroles, polyanilines, and polythiophenes; an organic light emitting device wherein the light emitting region comprises a material selected from the group consisting of metal oxinoids, aromatic tertiary amines, indolocarbazoles, triazines, stilbenes, anthracenes, oxadiazole metal chelates, and porphyrins; an organic light emitting device wherein the hole transport component is selected from the group consisting of aromatic tertiary amines and indolocarbazole compounds, and the electron transport material is selected from the group consisting of metal oxinoids, triazines, stilbenes, and oxadiazole metal chelates; the organic light emitting device wherein the hole transport material is selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and the electron transport material is tris(8-hydroxyquinoline) aluminum or bis(8-hydroxyquinolato)-(4-phenylphenolato)aluminum; an organic light emitting device wherein the second electrode comprises at least one material with work function of not more than about 4.5 eV; an organic light emitting device wherein the second electrode is a cathode possessing a work function of not more than about 4.5 eV, and which cathode is selected from the group consisting of Li, Ca, Al, Mg, In, Ag, Mg—Ag alloys, Mg—Al alloys and Al—Li alloys; an organic light emitting device comprising in sequence a glass substrate;

a first electrode anode comprised of, for example, indium-tin-oxide with thickness of from about 30 to about 300 nanometers;

a light emitting region situated on and in contact with the anode comprising a hole transport material selected from the group consisting of N,N-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and an electron transport material selected from the group consisting of tris(8-hydroxyquinoline) aluminum and bis(8-hydroxyquinolato)-(4-phenylphenolato) aluminum, and wherein the thickness of the light emitting region is from about 10 nanometers to about 300 nanometers; a cathode situated on and in contact with the light emitting region comprised of Al, Mg—Ag or Al—Li alloy of thickness from about 50 nanometers to about 500 nanometers; and a thermal protective layer or layers comprised of SiO, $SiO_2$ or mixtures thereof of a thickness of from about 100 nanometers to about 1,000 nanometers; an organic light emitting device wherein the thermal protective layer mixture comprises from about 0.1 to about 99.9 weight percent of SiO, and from about 99.9 to about 0.1 weight percent of $SiO_2$, and wherein the total thereof is about 100 percent; an organic light emitting device wherein the light emitting region includes a layer of a thickness of from about 10 nanometers to about 100 nanometers comprised of a mixture of from about 25 weight percent to about 75 weight percent of a hole transport material, and from about 75 weight percent to about 25 weight percent of an electron transport material; an organic light emitting device further containing a thermal protective element formed of a single layer or a plurality of stacked layers laminated in contact to each other; an electroluminescent device comprised of an optional supporting substrate, a first electrode, a second electrode, a light emitting region, and at least one thermal element; and an electroluminescent device wherein the thermal protective element is a layer, a plurality of layers, or a plurality of laminated layers, the first electrode is an anode, and the second electrode is a cathode, and the element is contained on the anode, or the cathode.

The thermal protective element(s) comprise(s), for example, a material having a thermal expansion coefficient such that the resistance of the device to shorting at elevated or high temperatures is reduced. A typical range for the thermal expansion coefficient can be, for example, from about $1 \times 10^{-10}$ meter/meter per degree Centigrade to about $9 \times 10^{-6}$ meter/meter per degree Centigrade, and preferably from about $1 \times 10^{-10}$ meter/meter per degree Centigrade to about $4 \times 10^{-6}$ meter/meter per degree Centigrade. Examples of materials that can be selected for the thermal protective element include, for example, organic compounds like porphyrins, such as copper phthalocyanine; inorganic materials like metal compounds, such as SiO, $SiO_2$, $ZrO_2$, $Si_3N_4$ and SiC; and metallic materials like pure, about 99 to 100 percent pure metals, such as Cr, Ti, Si, Ir, Pt, Os, V, Mo, Si, Zr, Ta, W and Sb, and metal alloys, such as Ni—Fe alloys, Ni—Cu, KOVAR® and Cr—Fe alloys. KOVAR® contains about 53 weight percent Fe, about 17 weight percent Co, about 29 weight percent Ni, about 0.2 weight percent Si, about 0.3 weight percent Mn, and about 0.02 weight percent carbon. The thickness of the thermal protective element, layer, or layers can vary and can be, for example, from about 1 nanometer to about 100 microns.

The organic EL devices according to embodiments of the present invention can be utilized in various applications, such as displays like screens of TVs, computers, and some handheld personal electronic devices, such as cellular phones, and which devices that are operated or stored over a broad temperature range, such as from about 25° C. to about 100° C.; wherein the organic EL devices are exposed to elevated temperatures of, for example, from about 70° C. to about 100° C., or higher, and wherein the adverse effects at these elevated temperatures on device performance, such as device shorting, are minimized or avoided. Examples of these applications include, for example, when it is desirable to thermally anneal the organic EL devices to achieve certain properties, reference copending application U.S. Ser. No. 09/629,163 (D/A0057), the disclosure of which is totally incorporated herein by reference, or wherein exposure of the organic EL device to elevated high temperatures is unavoidable.

BRIEF DESCRIPTION OF THE DRAWINGS

Specific embodiments of the present invention will be described in detail, with reference to the following figures, and in which.

DESCRIPTION OF EMBODIMENTS

The present invention in embodiments overcomes the disadvantage of a number of known prior art organic EL devices in the form of device shorting at high temperatures, and providing improved organic EL devices with enhanced stability at these temperatures. High temperatures refers, for example, to temperatures above 60° C., and specifically in the range of about 70° C. to about 100° C., or higher, such as, for example 120° C. The present invention relates to an organic EL device that contains at least one thermal protective element or layer. The thermal protective element or layer, for example, increases the device resistance to shorting at elevated temperatures, and thus improves the thermal stability thereof.

Figure 2:
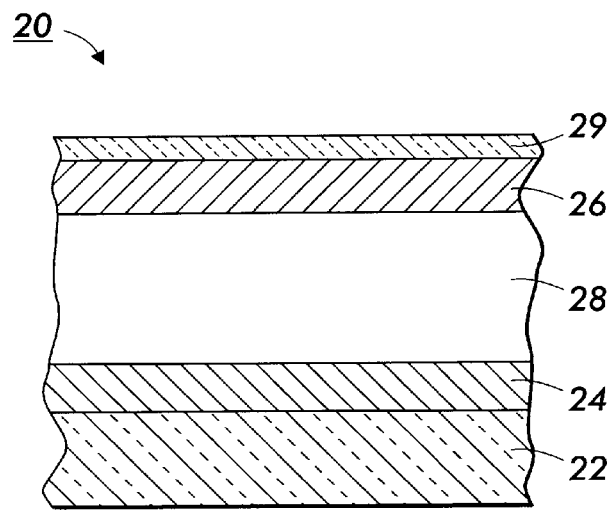
FIG. 2 illustrates embodiments of an organic EL device according to this invention.

An exemplary embodiment of an organic EL device according to this invention is illustrated in FIG. 2. The EL device 20 of FIG. 2 includes a substrate 22 comprised of, for example, glass; an anode 24 on the substrate 22, comprising at least one material with a high work function, typically from about 4 eV to about 6 eV, such as, for example, indium tin oxide (ITO); a light emitting region 28 formed on the anode 24, comprising an organic luminescent material, such as, for example, a metal oxinoid compound, a stilbene compound, an anthracene compound, a polyfluorene, or a poly(p-phenylenevinylene); a cathode 26 on the light emitting region 28 comprising at least one of (i) at least one material with a low work function, typically from about 2 eV to about 4 eV, such as, for example, calcium, magnesium, Mg:Ag alloy or Al:Li alloy, and (ii) a material with excellent electron injection properties, such as, for example, an alkaline metal halide like LiF or a metal oxide like $Al_2O_3$; and a thermal protective element, or layer 29 on the cathode 26 comprised of, for example, SiO, of thickness from about 1 nanometer to about 100 microns.

Figure 3:
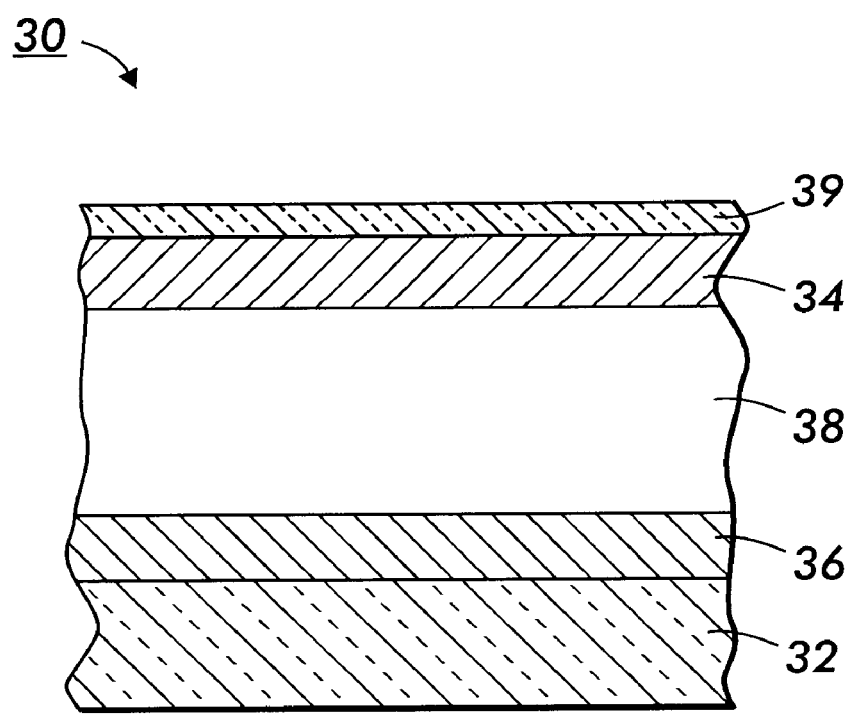
FIG. 3 illustrates embodiments of an organic EL device according to this invention.

Another exemplary embodiment of an organic EL device according to this invention is illustrated in FIG. 3. The EL device 30 includes a substrate 32 comprised of, for example, glass; a cathode 36 with first surface on the substrate 32, where the cathode 36 includes a layer comprising at least one of (i) a material with a low work function (typically <4 eV), which can be a metal, such as for example, Ca or Mg, a metal alloy, such as, for example, Mg:Ag or Al:Li, and (ii) a material with high electron injection properties, such as, for example, alkaline metal halides or oxides, or other suitable material; an anode 34 which includes a layer comprised of at least one material with a high work (typically less than >4 eV), such as, for example, indium tin oxide (ITO); and interposed between the second surface of the cathode 36 and the first surface of the anode 34 a light emitting region 38 formed of at least one layer of an organic material having light emitting properties, such as, for example, a metal oxinoid compound, a stilbene compound, an anthracene compound, a polyfluorene, or a poly(p-phenylenevinylene). On the second surface of the anode 34 is a thermal protective element or layer 39 comprised of, for example, SiO, of a thickness of from about 1 nanometer to about 100 microns. During operation, an applied electric field causes positive charges (holes) and negative charges (electrons) to be respectively injected from the anode 24, 34 and the cathode 26, 36 to recombine in the light emitting region 28, 38 and thereby produce light emission.

In embodiments of the organic light emitting devices according to this invention, the location of the thermal protective elements or layers in the organic light emitting device can be selected such that its effectiveness in enhancing the thermal stability of the organic light emitting devices is increased without causing any significant substantial adverse effects on other device performance characteristics such as, for example, device efficiency and/or operational stability. An exemplary embodiment of an alternative location for the EL thermal protective element to the one described in FIG. 2 can be an organic EL device with a thermal protective element interposed between the substrate 22 and the anode 24. Exemplary embodiments of alternative locations for the thermal protective element to those illustrated in FIGS. 2 and 3 can be an organic EL device with a thermal protective element or layer interposed between the substrate 22, and the anode 24, or an organic light emitting device with a thermal protective element or layer interposed between the substrate 32 and the cathode 36. Other exemplary embodiments of alternative locations for the thermal protective element or layer include an organic light emitting device with a thermal protective element or layer interposed between the light emitting region 28 and the cathode 26, between the light emitting region 38 and the anode 34, or with a thermal protective element within the light emitting regions 28 and 38. In these embodiments, the thermal protective element can be comprised of a single layer or a plurality of stacked layers laminated in contact to each other, and typically up to three layers. Element and layer or layers refers, for example, to a single protective layer, a plurality of protective layers in contact with each other, a plurality of protective layers wherein each layer is located at a different appropriate position in the EL device and the like. Thus, for example, an element can include thermal protective layers contacting each other; thermal protective layers are not contacting each other such as by being separated by other EL device layers, when they then become separate "elements", and hence plurality of elements. Therefore, for example, if in the EL device when there are two thermal protective layers, these two layers can either be (i) contacting each other hence forming just one element with a plurality of layers (2 in this configuration), or (ii) two thermal protective layers separated from each other by other EL device layers, and hence forming two elements each comprised of a single layer.

In embodiments, the organic light emitting device can have a plurality of thermal protective elements wherein the number of thermal protective elements in the organic light emitting device can be, for example, about four and typically one or two. In these embodiments, the individual thermal protective elements can be similar or different from each other in terms of, for example, but not limited to the materials, ratios of different materials, thickness, or methods of fabrication thereof. An exemplary embodiment of an organic EL device with a plurality of thermal protective elements is a device with a first thermal protective element of thickness from about 1 nanometer to about 1,000 nanometers comprised of, for example, one or more materials selected from the materials with thermal expansion coefficients in certain desirable ranges such as, for example, organic compounds, like porphyrins such as copper phthalocyanine; inorganic materials like metal compounds, such as SiO, $SiO_2$, $ZrO_2$, $Si_3N_4$ and SiC; and metallic materials like pure metals, such as Cr, Ti, Si, Ir, Pt, Os, V, Mo, Si, Zr, Ta, W and Sb, and like metal alloys, such as Ni—Fe alloys, Ni—Cu, KOVAR® and Cr—Fe alloys, interposed between the substrate and the first electrode; and a second thermal protective element of thickness, for example, of from about 1 nanometer to about 100 microns comprising one or more materials with certain thermal expansion coefficients in certain desirable ranges, such as, for example, organic compounds, like porphyrins, such as copper phthalocyanine; inorganic materials like metal compounds, such as SiO, $SiO_2$, $ZrO_2$, $Si_3N_4$ and SiC; and metallic materials like pure metals, such as Cr, Ti, Si, Ir, Pt, Os, V, Mo, Si, Zr, Ta, W and Sb, and like metal alloys, such as Ni—Fe alloys, Ni—Cu, KOVAR® and Cr—Fe alloys, on the second electrode. Another exemplary embodiment of an organic EL device with a plurality of thermal protective elements is a device with a first thermal protective element of thickness of from about 1 nanometer to about 1,000 nanometers comprised of, for example, one or more materials with thermal expansion coefficients in certain desirable ranges like those listed above, interposed between the substrate and the first electrode; a second thermal protective element of thickness, for example, from about 1 nanometer to about 100 microns comprising one or more materials with certain thermal expansion coefficients in certain desirable ranges like those listed above, on the second electrode; and a third thermal protective element of thickness ranging, for example, from about 1 nanometer to about 10 nanometers comprising a material with suitable thermal expansion coefficient and suitable charge injection properties, such as for example, copper phthalocyanine or an alkaline metal compound like LiF, CsF, or $Al_2O_3$ interposed between the light emitting region and the second electrode.

In embodiments according to this invention, the thermal protective element 29, 39 can be formed of one layer, or a plurality of stacked layers laminated in contact with each other, and typically up to about 3 to about 4 layers. With a thermal protective element formed of a plurality of layers, the individual layers can be similar or different from each other in terms of, for example, but not limited to, materials, ratios of material content, thickness, or methods of fabrication thereof. Where the organic light emitting devices comprise a plurality of thermal protective elements some or all of the individual thermal protective elements can be comprised of a single layer or a plurality of layers.

In embodiments, the light emitting region 28, 38 can further comprise one or more of hole transport materials and electron transport materials. Suitable hole transport materials include, for example, polyphenylenevinylenes, polythiophenes, tertiary aromatic amines, indolocarbazole compounds, and others. Suitable electron transport materials include, for example, metal oxinoids, triazines, oxadiazole metal chelate, stilbenes, polyfluorenes, and others; the light emitting region 28, 38 can further comprise an organic luminescent material as a dopant. Examples of organic luminescent materials that can be used as dopants in the light emitting region 18, 28 are fluorescent materials and phosphorescent materials, examples of which can be selected from those illustrated in copending U.S. Ser. No. 09/606,670 and U.S. Pat. No. 4,769,292, the disclosures of each being totally incorporated herein by reference.

The light emitting region of, for example, 28, 38 comprises a mixed region comprised of a hole transport material and an electron transport material, and includes one organic luminescent material. In these embodiments, at least one of the hole transport material and the electron transport material comprising the mixed region is an organic luminescent material; or the mixed region further comprises an organic luminescent material as a dopant, in which at least one of the hole transport material and the electron transport material comprising the mixed region can also be a luminescent material, reference copending patent applications U.S. Ser. No. 09/357,551, filed on Jul. 20, 1999, and U.S. Ser. No. 09/606,670, filed on Jun. 30, 2000, the disclosures of each being totally incorporated herein by reference.

The light emitting region 28, 38 can further comprise at least one of (i) a hole transport region adjacent to the anode 24, 34; and (ii) an electron transport region adjacent to the cathode 26, 36. Such transport regions may be formed from suitable hole and electron transport materials, such as those listed above, and reference U.S. Pat. No. 4,769,292, the disclosure of which is totally incorporated herein by reference. In other embodiments, the light emitting region 28, 38 is formed of a hole transport region comprised of a hole transport material on the anode, and an electron transport region comprised of an electron transport material adjacent to the cathode, such as those disclosed in U.S. Pat. No. 4,539,507, the disclosure of which is totally incorporated herein by reference. Examples of suitable materials for forming the hole transport region, and the electron transport region can be selected from those disclosed above.

The organic light emitting devices can be fabricated to emit light over a broad range of wavelengths. By selection of suitable combinations and mixtures of the emitting materials, hole transport materials and the electron transport materials, light emission can be achieved at wavelengths of from about 400 nanometers to about 700 nanometers from the organic light emitting devices. Accordingly, the organic light emitting devices of this invention can emit light having a range of different colors by appropriate material selection. This versatility of emission colors enables the organic light emitting devices of this invention to be used in various applications where certain specific light colors, such as red, green or blue, are desired.

Various organic luminescent materials, hole transport materials and electron transport materials can be selected to, for example, achieve desired color emissions. Furthermore, the selection of such materials to provide a desired color emission can be readily conducted by one of ordinary skill in the art using routine experimentation. The organic EL devices can be operated under AC and/or DC driving conditions. AC driving conditions are preferred to provide extended operational lifetimes, especially in high temperature device operation conditions.

The substrate 22, 32 can comprise various suitable materials including, for example, polymeric components, glass, quartz and the like. Suitable polymeric components include, but are not limited to, polyesters, such as MYLAR®, polycarbonates, polyacrylates, polymethacrylates, polysulfones, and the like. Other substrate materials can also be selected provided, for example, that the materials can effectively support the other layers, and do not interfere with the device functional performance. Preferably, in embodiments, the substrate is formed of a transparent material with light transmission ranging from about 80 percent to about 100 percent.

The thickness of the substrate 22, 32 is not particularly limited except perhaps by the structural demands of the organic light emitting device and its intended use. Suitable thicknesses include, for example, from at least about 25 $\mu$m to about 5,000 $\mu$m, and more specifically, from about 50 $\mu$m to about 1,000 $\mu$m.

The anode 24, 34 can comprise suitable positive charge injecting electrodes, such as indium tin oxide (ITO), tin oxide, gold, electrically conductive carbon, $\pi$-conjugated polymers, such as polyaniline, polythiophene, polypyrrole, and the like, having, for example, a work function equal to, or greater than, about 4 eV, and preferably from about 4 eV to about 6 eV.

The anode 24, 34 can be of any suitable form. A thin conductive layer can be coated onto a light transmissive substrate, for example a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å and preferably from about 75 Å to about 150 Å can be used. These thin anodes can comprise metals such as gold, palladium and the like. In addition, transparent or semi-transparent thin layers of conductive carbon or conjugated polymers, such as polyaniline, polythiophene, polypyrrole and the like, having a thickness of, for example, from about 50 Å to about 175 Å can be used as anodes. Additional suitable forms of the anode (and the cathode) are disclosed in U.S. Pat. No. 4,885,211, the disclosure of which is totally incorporated herein by reference.

The thickness of the anode 24, 34 can range from about 1 nanometer to about 5,000 nanometers with the preferred range depending on the optical constants of the anode material. One preferred range of thickness of the anode is from about 30 nanometers to about 300 nanometers.

The cathode 26, 36 can comprise any suitable metal, including high work function components, having a work function, for example, of from about 4.0 eV to about 6.0 eV, or low work function components, such as metals with, for example, a work function of from about 2.5 eV to about 4.0 eV. The cathode 26, 36 can comprise a mixture of a low work function (less than about 4 eV) metal and a high work function (equal to or more than about 4 eV), such as, for example, metal from about 4.5 to about 8. Effective proportions of the low work function metal to the second or other metal are from less than about 0.1 weight percent to about 99.9 weight percent. Illustrative examples of low work function metals include, but are not limited to, alkaline metals, such as lithium or sodium; Group 2A or alkaline earth metals, such as beryllium, magnesium, calcium or barium; and Group III metals including rare earth metals and the actinide group metals, such as scandium, yttrium, lanthanum, cerium, europium, terbium or actinium. Lithium, magnesium and calcium are preferred low work function metals.

The Mg—Ag alloy cathodes of U.S. Pat. No. 4,885,211, the disclosure of which is totally incorporated herein by reference, are one preferred cathode construction. Another preferred cathode construction is described in U.S. Pat. No. 5,429,884, the disclosure of which is totally incorporated herein by reference, wherein the cathodes are formed from lithium alloys with other high work function metals such as aluminum and indium.

Other cathode configurations include transparent contacts according to U.S. Pat. No. 5,703,436, the disclosure of which is totally incorporated herein by reference.

The cathode 26, 36 can also include an electron injection layer or a buffer layer in contact with the light emitting region comprised of a conductive or an insulative material, such as an oxide material, an alkaline metal compound, a porphyrin compound or napthacene compound. The thickness of the cathode can range from, for example, about 5 nanometers to about 500 nanometers. Thicknesses outside of this range may also be used.

The light emitting region 28, 38 can be of any suitable material including at least one organic luminescent material. Suitable organic luminescent materials include, for example, polyphenylenevinylenes, such as poly(p-phenylenevinylene) PPV, poly(2-methoxy-5-(2-ethylhexyloxy) 1,4-phenylenevinylene) MEHPPV and poly (2,5-dialkoxy phenylenevinylene) PDMeOPV, and others as more generally disclosed in U.S. Pat. No. 5,247,190, the disclosure of which is totally incorporated herein by reference; polyphenylenes, such as poly(p-phenylene) PPP, ladder-poly-para-phenylene (LPPP), and poly (tetrahydropyrene) PTHP; and polyfluorenes, such as poly (9,9-di-n-octylfluorene-2,7-diyl), poly(2,8-(6,7,12,12-tetraalkylindenofluorene) and copolymers containing fluorenes, such as fluorene-amine copolymers (e.g. Bernius et al. *Proceedings of SPIE Conference on Organic Light Emitting Materials and Devices III*, Denver, Colo., Jul. 1999, Vol. 3797, p129).

Another class of organic materials with light emitting properties that can be utilized in the light emitting region 28, 38 includes, but is not limited to, the metal oxinoid compounds as disclosed in U.S. Pat. Nos. 4,539,507; 5,151,629; 5,150,006, 5,141,671, and 5,846,666, the disclosures of each of which are totally incorporated herein by reference. Illustrative examples include tris(8-hydroxyquinolinate) aluminum ($Alq_3$), which is one preferred example, and bis(8-hydroxyquinolato)-(4-phenylphenolato) aluminum (BAlq) which is another preferred example. Other examples of this class of materials include tris(8-hydroxyquinolinate) gallium, bis(8-hydroxyquinolate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h] quinolinate) beryllium, and the like, and metal thioxinoid compounds illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methyl quinolinethiolato)zinc, tris(5-methylquinolinethiolato) gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

Yet more specifically, a class of organic materials with light emitting properties which can be selected for the light emitting region 28, 38 comprises stilbene derivatives, such as those disclosed in U.S. Pat. No. 5,516,577, the disclosure of which is totally incorporated herein by reference. A preferred stilbene derivative is 4,4'-bis(2,2-diphenylvinyl) biphenyl. Yet, another class of suitable organic materials with light emitting properties suitable for utilizing in the light emitting region 28, 38 are the oxadiazole metal chelates disclosed in copending application U.S. Ser. No. 08/829, 398, filed Mar. 31, 1997, the disclosure of which is totally incorporated herein by reference. These materials include bis[2-(2-hydroxyphenyl)-5-phenyl-1,3,4-oxadiazolato]zinc; bis[2-(2-hydroxyphenyl)-5-phenyl-1,3,4-oxadiazolato] beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis [2-(2-hydroxyphenyl)-5-p-tolyl-1,3,4-oxadiazolato]zinc; bis [2-(2-hydroxyphenyl)-5-p-tolyl-1,3,4-oxadiazolato] beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis [2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3, 4-thiadiazolato]zinc; bis[2-(2-hydroxyphenyl)-5-phenyl-1, 3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; the triazines as those disclosed in copending application U.S. Ser. No. 09/489,144 and U.S. Pat. No. 6,057,048, the disclosures of which are totally incorporated herein by reference. The light emitting region 28, 38 may further comprise one or more luminescent materials as dopants.

The light emitting region 28, 38 can further include from about 0.01 weight percent to about 25 weight percent of a luminescent material as a dopant. Examples of dopant materials that can be utilized in the light emitting region 28, 38 are fluorescent materials, such as, for example, coumarin, dicyanomethylene pyranes, polymethine, oxabenzanthrane, xanthene, pyrylium, carbostyl, perylene, and the like; another specially preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethyl quinacridone, N,N'-dimethyl-2-chloroquinacridone, N,N'-dimethyl-2-fluoroquinacridone, N,N'-dimethyl-1,2-benzoquinacridone, and the like, and those disclosed in U.S. Pat. Nos. 5,227,252; 5,276,381 and 5,593,788, the disclosures of which are totally incorporated herein by reference. Also, a class of fluorescent materials that may be selected are fused ring fluorescent dyes. Examples of the fused ring fluorescent dyes include perylene, rubrene, anthracene, coronene, phenanthracene, pyrene and the like, as illustrated in U.S. Pat. No. 3,172,862, the disclosure of which is totally incorporated herein by reference. Also, fluorescent materials include butadienes, such as 1,4-diphenylbutadiene and tetraphenylbutadiene, stilbenes, and the like as illustrated in U.S. Pat. Nos. 4,356,429 and 5,516,577, the disclosures of which are totally incorporated herein by reference. Other examples of fluorescent materials that can be used are those disclosed in U.S. Pat. No. 5,601,903, the disclosure of which is totally incorporated herein by reference.

Additionally, luminescent dopants that can be utilized in the light emitting region 28, 38 are the fluorescent dyes disclosed in U.S. Pat. No. 5,935,720, the disclosure of which is totally incorporated herein by reference, such as, for example, 4-(dicyanomethylene)-2-1-propyl-6-(1,1,7,7-tetramethyl julolidyl-9-enyl)-4H-pyran (DCJTB); the lanthanide metal chelate complexes, such as for example, tris(acetyl acetonato)(phenanthroline) terbium, tris(acetyl acetonato)(phenanthroline) europium, and tris(thenoyl trisfluoroacetonato)(phenanthroline) europium, as those disclosed in Kido et al., "White light emitting organic electroluminescent device using lanthanide complexes", *Jpn. J. Appl. Phys., Volume* 35, pp. L394–L396 (1996); and phosphorescent materials, such as, for example, organometallic compounds containing a heavy metal atoms that lead to strong spin-orbit coupling, such as those disclosed in Baldo et al., "Highly efficient organic phosphorescent emission from organic electroluminescent devices", *Letters to Nature*, Volume 395, pp 151–154 (1998). Preferred examples include 2,3,7,8,12,13,17,18-octaethyl-21H,23H-phorpine platinum(II) (PtOEP) and fac tris(2-phenylpyridine)iridium (Ir(ppy)$_3$).

The light emitting region 28, 38 can also include one or more materials with hole-transporting properties. Examples of hole transporting materials that can be utilized in the light emitting region 28, 38 include polypyrrole, polyaniline, poly(phenylene vinylene), polythiophene, polyarylamine, U.S. Pat. No. 5,728,801, the disclosure of which is totally incorporated herein by reference, and their derivatives, and known semiconductive organic materials; porphyrin derivatives, such as 1,10,15,20-tetraphenyl-21 H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like.

A specific class of hole transporting materials that can be selected in the light emitting region 28, 38 are the aromatic tertiary amines, such as those disclosed in U.S. Pat. No. 4,539,507, the disclosure of which is totally incorporated herein by reference. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like.

Yet another class of aromatic tertiary amines selected for the hole transporting layer are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino) -4-biphenylyl]-m-toluidine; N,N-bis-[4'-(N-phenyl-N-m-tolylamino) -4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino) -4-biphenylyl]-m-chloroaniline; N,N-bis-[4'-(N-phenyl-N-m-tolylamino) -4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the light emitting region 28 are the indolocarabazoles, such as those illustrated in U.S. Pat. Nos. 5,942,340 and 5,952,115, the disclosures of which are totally incorporated herein by reference, such as, for example, 5,11-di-naphthyl -5,11-dihydroindolo[3,2-b]carbazole, and 2,8-dimethyl-5,11-di-naphthyl -5,11-dihydroindolo[3,2-b] carbazole; N,N,N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transporting materials that can be used in the light emitting region 28, 38 are the naphthyl-substituted benzidine derivatives.

The light emitting region 28, 38 can also include one or more materials with electron transporting properties. An example of electron transporting materials that can be utilized in the light emitting region 28, 38 is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, reference Bernius et al. *Proceedings of SPIE Conference on Organic Light Emitting Materials and Devices III*, Denver, Colo., Jul. 1999, Vol. 3797, p129, the disclosure of which is totally incorporated herein by reference.

Other examples of electron transporting materials that can be utilized in the light emitting region 28, 38 can be selected from the metal oxinoid compounds, the oxadiazole metal chelate compounds, the triazine compounds and the stilbene compounds, examples of which have been disclosed above in more detail.

The thickness of the light emitting region 28, 38 can vary from, for example, about 1 nanometer to about 1000 nanometers, typically from about 20 nanometers to about 200 nanometers, and preferably from about 50 nanometers to about 150 nanometers.

The thermal protective element 29, 39 is formed of at least one layer comprising at least one material with a thermal expansion coefficients in a certain range such that the susceptibility of the device to shorting at elevated temperatures, such as temperatures ranging from about 70° C. to about 100° C., is prevented or minimized. The selection of suitable materials with suitable thermal expansion coefficients to be used in forming the thermal protective element depends on the thermal expansion coefficients of the other materials comprising the organic light emitting device, especially the materials comprising the substrate 22, 32 and the materials comprising the light emitting region 28, 38 and in the same time such materials must be selected such that the thermal protective element has no significant adverse effects on other device performance characteristics, such as, for example, device efficiency and/or stability. A typical range for the thermal expansion coefficient can be, for example, from about $1 \times 10^{-10}$ meter/meter per degree Centigrade to about $9 \times 10^{-6}$ meter/meter per degree Centigrade, and preferably from about $1 \times 10^{-10}$ meter/meter per degree Centigrade to about $4 \times 10^{-6}$ meter/meter per degree Centigrade.

The materials utilized in the thermal protective element 29, 39 can be selected from any suitable class of materials, such as, for example, organic compounds, inorganic materials; metallic materials; and mixtures thereof; such that certain desired thermal properties are obtained.

An example of a class of organic materials that can be used in the thermal protective element 29, 39 are the porphyrin derivatives such as 1,10,15,20-tetraphenyl-21H, 23H-porphyrin copper (II) disclosed in U.S. Pat. No. 4,356,429, the disclosure of which is totally incorporated herein by reference; copper phthalocyanine, copper tetramethyl phthalocyanine, zinc phthalocyanine, titanium oxide phthalocyanine, magnesium phthalocyanine, and the like.

Organic materials that can be used in the thermal protective element 29, 39 are the metal oxinoid compounds as disclosed in U.S. Pat. Nos. 4,539,507; 5,151,629; 5,150,006, 5,141,671, and 5,846,666, the disclosures of which are totally incorporated herein by reference. Illustrative examples include tris(8-hydroxyquinolinate) aluminum (Alq$_3$), which is one preferred example, and bis(8-hydroxyquinolato)-(4-phenylphenolato) aluminum (BAlq) which is another preferred example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h] quinolinate) beryllium, and the like, and metal thioxinoid compounds illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, bis(8-quinolinethiolato) gallium, tris(8-quinolinethiolato)indium, bis(5-methylquinolinethiolato)zinc, tris(5-methylquinolinethiolato)gallium, tris(5- methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato] zinc, bis[3,7-dimethylbenzo{f}-8-quinolinethiolato]zinc, and the like. Preferred materials are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc.

Examples of inorganic materials that can be selected in the thermal protective element include 29, 39 elemental materials, such as, for example, carbon, such as amorphous carbon or graphite. A specific class of inorganic materials that can be selected as the thermal protective element 29, 39 are metallic compounds, such as, for example, metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; metal halides, like LiF, KCl, NaCl, CsCl, CsF and KF; and metal nitirides and carbides, like $Si_3N_4$ and SiC. Examples of metallic components for the thermal protective element 29, 39 include pure metals, such as for example, Cr, Ti, Si, Ir, Pt, Os, V, Mo, Si, Zr, Ta, W and Sb. Other examples of metallic materials that can be used in the thermal protective element 29, 39 include metallic alloys, such as, for example, Ni alloys, like Ni—Fe alloys, Ni—Cu and KOVAR®, Fe alloys, and Cr alloy, such as for example, Cr—Fe alloys.

The thickness of the thermal protective element, such as 29, 39, can be from about 1 nanometer to about 100 microns, depending, for example, on the location of the thermal protective element 29, 39 in the organic light emitting device. For instance, in embodiments wherein the thermal protective element is interposed between the light emitting region and the first and/or second electrode, a thickness range for the thermal protective element can be, for example, from about 1 nanometer to about 10 nanometers, while in embodiments wherein the thermal protective element is coated on the second electrode, a thickness range for the thermal protective element can be, for example, from about 10 nanometers to about 100 microns.

The thermal protective element 29, 39 can be prepared by forming one of the above-described materials into thin films by any suitable known or later developed method. Suitable methods for this purpose include, for example, vapor deposition, sputtering, electron beam, arc evaporation and spin-coating techniques. Of these methods, vapor deposition and sputtering are more preferred.

The thermal protective element 29, 39 can also be formed by any suitable method that enables the formation of layers comprising a mixture of two or more materials. For example, it can be formed by co-evaporating two or more materials to obtain a mixture composed of certain amounts of the desired materials.

The following Examples are provided to further illustrate various aspects of this invention, and are not intended to limit the scope of the invention.

EXAMPLES

A first organic light emitting device according to this invention having a structure, such as device 20 shown in FIG. 2, was formed and evaluated. In this device a naphthyl-substituted benzedrine derivative, N,N'-di-1-naphthyl-N,N'-diphenyl-1,1'-biphenyl-1,1'-biphenyl-4,4'-diamine (NPB), and tris(8-hydroxyquinoline) aluminum ($Alq_3$), was used as the hole transport material and the electron transport material, respectively, comprising the light emitting region 28. The light emitting region 28 was comprised of (i) a hole transport region of about 80 nanometers thick comprised of NPB, (ii) a mixed region of about 80 nanometers thick comprised of about 49.9 weight percent of NPB, about 49.9 weight percent of $AlQ_3$, and about 0.2 weight percent of dimethylethylquinacridone (DMQ) emitting dopant, and (iii) an electron transport region of about 20 nanometers thick comprised of $AlQ_3$. The light emitting region 28 was interposed or situated in between the anode 24 comprised of indium-tin-oxide (ITO) of about 30 nanometers thick, precoated on a glass substrate 22, and a cathode 26 of about 120 nanometers thick comprised of a Mg:Ag alloy. On the cathode 26, there was present 100 percent coverage of a thermal protective element with thickness of about 200 nanometers and comprised of SiO, and which SiO possesses a low thermal expansion coefficient of about $4 \times 10^{-7}$ meter/meter per degree Centigrade, and which layer can be easily formed using a vacuum deposition technique used in forming the other components of the organic light emitting device.

The organic light emitting device was fabricated using a vacuum deposition process at a pressure of about $6 \times 10^{-6}$ Torr. The hole transport region of the light emitting region 28 was first formed on the ITO anode 24, was followed by the mixed region; the electron transport region and the cathode 26. Following the deposition of the cathode 26, the thermal protective element 29 was formed by the deposition of evaporated SiO on the cathode at a rate of about 0.1 nanometer without breaking the vacuum.

Figure 1:
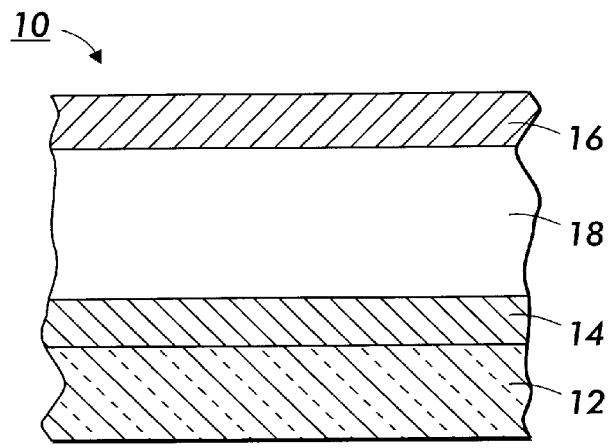
FIG. 1 illustrates a known organic EL device.

A second organic light emitting device of a known structure, reference device 10 shown in FIG. 1, which was in all respects identical to the first organic light emitting device, except for not having the thermal protective element, was also fabricated and evaluated under the same conditions as in the first organic light emitting device to be used as a reference.

In this second device, NPB and $Alq_3$ were used as the hole transport material and the electron transport material, respectively, comprising the light emitting region 18. The light emitting region 18 was comprised of (i) a hole transport region of about 80 nanometers thick comprised of NPB; (ii) a mixed region of about 80 nanometers thick comprised of about 49.9 weight percent of NPB, about 49.9 weight percent of $AlQ_3$, and about 0.2 weight percent of dimethylethylquinacridone (DMQ) emitting dopant, and (iii) an electron transport region of about 20 nanometers thick comprised of $AlQ_3$. The light emitting region 18 was interposed between the anode 14 comprised of indium-tin-oxide (ITO) of about 30 nanometers thick, precoated on a glass substrate 12, and a cathode 16 of about 120 nanometers thick comprised of a Mg:Ag alloy.

The second organic light emitting device was fabricated using a vacuum deposition process at a pressure of about $6 \times 10^{-6}$ Torr. The hole transport region of the light emitting region 18 was first formed on the ITO anode 14, followed by the mixed region, and the electron transport region, followed by the cathode 16 without breaking the vacuum.

Evaluation of the electroluminescence characteristics of the above two organic light emitting devices indicated that the electroluminescence efficiency and the driving voltage of the first device (organic light emitting device according to this invention) was similar to that of the second known device, amounting to about 5.5 cd/A and about 8 V, for the electroluminescence efficiency and the driving voltage, respectively, at a current density of 25 $mA/cm^2$, for the two devices.

Stability tests were then conducted to determine the high temperature operational stability of the above prepared first and second organic light emitting devices at 100° C. The operational lifetime was tested with the organic light emitting devices operated at an average constant current of 31.25 mA/cm² using AC driving in a dry air atmosphere. Results from stability tests, recorded in the form of normalized luminance (equal to luminance/initial luminance, L/Lo) and normalized operating voltage (equal to operating voltage/initial operating voltage V/Vo) measured after various periods of time of continuous device operation at 100° C. are provided in the following table.

| Period of Time of Continuous Device Operation at 100° C. Before the Measurements are Taken (In Hours) | First Device L/Lo | First Device V/Vo | Second Device L/Lo | Second Device V/Vo |
|---|---|---|---|---|
| 0.01 | 1.0 | 1.0 | 1.0 | 1.0 |
| 0.05 | 0.99 | 1.01 | 0.99 | 1.01 |
| 0.09 | 0.99 | 1.01 | 0.99 | 1.02 |
| 0.1 | 0.99 | 1.02 | 0.0 | 0.4 |
| 1.0 | 0.98 | 1.04 | 0.0 | 0.4 |
| 5.0 | 0.96 | 1.05 | 0.0 | 0.4 |
| 10.0 | 0.90 | 1.08 | 0.0 | 0.4 |
| 10.0 | 0.80 | 1.2 | 0.0 | 0.4 |

The test results indicate that the organic light emitting device without the thermal protective element (second device) shorts (was electrically shorted) after operation for about 0.1 hour, which is indicated by the sudden decrease in the normalized luminance, which appears as a decrease in the normalized luminance of from about 1 to about zero in a very short period of time, such as, for example, in less than a minute, and a simultaneous sudden decrease in the normalized operating voltage which appears as a decrease in the normalized voltage of from about 1 to about 0.4 or in a very short period of time, such as, for example, in less than a minute. The first invention organic light emitting device, which is a device with a thermal protective element according to the present invention, did not show any such sudden decreases in the normalized luminance or the normalized driving voltage even up to 100 hours of operation at a temperature of 100° C. The results, therefore, illustrate the higher thermal stability of the organic light emitting devices of embodiments of the present invention, and which devices do not short when operated for a period of 100 hours at 100° C. in comparison to devices without the thermal protective element, which short after only about 0.1 hour of operation at 100° C.

Similar results are believed to be achievable as the above with other EL devices encompassed by the present invention as compared to a number of prior art EL devices.

The organic light emitting devices according to this invention can be used in various normal temperature condition technological applications. Furthermore, the high temperature operational stability of the organic light emitting devices enables the devices to be used at high temperatures and in harsh conditions. For example, the devices can be used in various types of displays, such as, for example, in automobiles and other types of vehicles, computer monitors, televisions and other like electronic devices and systems. Moreover, the devices can be used in harsh conditions such as in industrial applications where high temperatures are often present. Thus, the organic light emitting devices according to this invention can be used in applications in which conventional devices without the thermal protective element would not be suitable.

Other modifications of the present invention will or may occur to those of ordinary skill in the art subsequent to a review of the present application. These modifications and equivalents thereof are intended to be included within the scope of the present invention.

What is claimed is:

1. An organic light emitting device comprising in sequence a substrate;
   a first electrode;
   a light emitting region comprising an organic luminescent material; and
   a second electrode, and a thermal protective element, and wherein said thermal protective element is of a thickness of from about 10 nanometers to about 100,000 nanometers, and wherein said thermal protective element is selected from the group consisting of organic compounds, inorganic compounds, metals, metal alloys, and mixtures thereof.

2. An organic light emitting device in accordance with claim 1 wherein one of the first electrode and second electrode serves as an anode, and one of the first electrode and second electrode serves as a cathode, and at least one thermal protective element.

3. An organic light emitting device in accordance with claim 2 wherein the thermal expansion coefficient of the thermal protective layer is from about $1 \times 10^{-10}$ meter/meter per degree Centigrade to about $9 \times 10^{-6}$ meter/meter per degree Centigrade, and wherein one of the first electrode and second electrode serves as an anode, and one of the first electrode and second electrode serves as a cathode, and wherein at least one thermal protective element is from about 1 to about 4 layers.

4. An organic light emitting device in accordance with claim 2 wherein the thermal expansion coefficient of the thermal protective element or layer is from about $1 \times 10^{-10}$ meter/meter per degree Centigrade to about $4 \times 10^{-6}$ meter/meter per degree Centigrade, and wherein one of the first electrode and second electrode serves as an anode, and one of the first electrode and second electrode serves as a cathode, and wherein at least one thermal protective element is a single layer.

5. An organic light emitting device in accordance with claim 2 wherein the thermal protective element or layer is situated on said first electrode, on said second electrode and/or on said light emitting region comprising an organic luminescent material, and wherein one of the first electrode and second electrode serves as an anode, and one of the first electrode and second electrode serves as a cathode.

6. An organic light emitting device in accordance with claim 2 wherein said thermal protective element is formed of a plurality of adjacent thermal protective layers, and wherein the individual thermal protective layers are comprised of similar or different materials.

7. An organic light emitting device in accordance with claim 2 wherein the thickness of said thermal protective element is from about 10 nanometers to about 100,000 nanometers, and wherein one of the first electrode and second electrode serves as an anode, and one of the first electrode and second electrode serves as a cathode.

8. An organic light emitting device in accordance with claim 2 wherein the thickness of said thermal protective element is from about 1 nanometer to about 10 nanometers, and wherein one of the first electrode and second electrode serves as an anode, and one of the first electrode and second electrode serves as a cathode.

9. An organic light emitting device in accordance with claim 6 wherein the thickness of each of the individual thermal layers is from about 1 nanometer to about 2,000 nanometers.

10. An organic light emitting device in accordance with claim 2 wherein there is from about 2 to about 4 thermal protective elements or layers.

11. An organic light emitting device in accordance with claim 10 wherein said thermal protective element, layer, or layers is comprised of the same or different materials.

12. An organic light emitting device in accordance with claim 2 wherein said thermal protective element, layer, or layers is coated on the second electrode.

13. An organic light emitting device in accordance with claim 2 wherein said thermal protective element is comprised of a material selected from the group consisting of organic compounds, inorganic compounds, metals, metal alloys, and mixtures thereof; and optionally wherein the thermal expansion coefficient of this material is from about $1 \times 10^{-10}$ meter/meter per degree Centigrade to about $9 \times 10^{-6}$ meter/meter per degree Centigrade.

14. An organic light emitting device in accordance with claim 13 wherein said organic compound is copper phthalocyanine.

15. An organic light emitting device in accordance with claim 13 wherein said inorganic compound is a metal compound selected from the group consisting of metal oxides, metal halides, metal carbides and metal nitrides.

16. An organic light emitting device in accordance with claim 15 wherein said metal oxide is selected from the group consisting of $MgO$, $Al_2O_3$, $BeO$, $BaO$, $AgO$, $SrO$, $SiO$, $SiO_2$, $ZrO_2$, $CaO$, $Cs_2O$, $Rb_2O$, $Li_2O$, $K_2O$ and $Na_2O$; and said metal halide is selected from the group consisting of LiF, KCl, NaCl, CsCl, CsF and KF.

17. An organic light emitting device in accordance with claim 15 wherein the metal compound is a silicon compound.

18. An organic light emitting device in accordance with claim 17 wherein the silicon compound is SiO, or $SiO_2$.

19. An organic light emitting device in accordance with claim 13 wherein the metal is selected from the group consisting of Cr, Ti, Si, Ir, Pt, Os, V, Mo, Si, Zr, Ta, W, and Sb; and wherein the metal alloy is selected from the group consisting of Ni, Fe, Cr, Ti, Si, Ir, Pt, Os, V, Mo, Si, Zr, Ta, W, and Sb alloys.

20. An organic light emitting device in accordance with claim 2 wherein said thermal protective element is comprised of a carbon compound.

21. An organic light emitting device in accordance with claim 1 wherein the light emitting region comprises a hole transport region adjacent to the first electrode and comprised of a hole transport material, and an electron transport region adjacent to the second electrode and comprised of an electron transport material, and wherein at least one of the hole transport region and the electron transport region emits light, and wherein one of the first electrode and second electrode serves as an anode, and one of the first electrode and second electrode serves as a cathode, and at least one thermal protective element situated on said cathode, said anode, or said cathode and said anode, and wherein said hole transport region is situated adjacent to said anode and said electron transport region is in contact with said cathode.

22. An organic light emitting device in accordance with claim 1 wherein the light emitting region comprises a hole transport region adjacent to the first electrode and which electrode is an anode, and which region is comprised of a hole transport material; an electron transport region adjacent to the second electrode and which electrode is a cathode, and which electron transport is comprised of an electron transport material and said light emitting layer situated in between the hole transport region and the electron transport region comprised of an organic luminescent material, and further including a protective thermal element coated on said anode, said cathode, or said anode and said cathode, and wherein said hole transport region is situated adjacent to said anode and said electron transport region is in contact with said cathode.

23. An organic light emitting device in accordance with claim 1 wherein the light emission region comprises a mixed region comprising a mixture of a hole transport material and an electron transport material, and wherein one of the first electrode and second electrode serves as an anode, and one of the first electrode and second electrode serves as a cathode, and further including at from 1 to about 4 thermal protective elements.

24. An organic light emitting device in accordance with claim 1 wherein the light emission region comprises a mixed region comprising a mixture of a hole transport material and an electron transport material; and the light emitting region further comprises at least one of (i) a hole transport region interposed between the first electrode and the mixed region; and (ii) an electron transport region interposed between the second electrode and the mixed region, and wherein at least one of the hole transport region, the electron transport region and the mixed region emits light, and wherein one of the first electrode and second electrode serves as an anode, and one of the first electrode and second electrode serves as a cathode, and wherein said thermal protective element is coated on said anode or said cathode, and wherein said hole transport region is situated adjacent to said anode and said electron transport region is in contact with said cathode.

25. An organic light emitting device in accordance with claim 1 wherein the light emission region comprises a component selected from the group consisting of polyphenylenes, polyphenylvinylenes, polyfluorenes, polypyrroles, polyanilines, and polythiophenes.

26. An organic light emitting device in accordance with claim 1 wherein the light emitting region comprises a material selected from the group consisting of metal oxinoids, aromatic tertiary amines, indolocarbazoles, triazines, stilbenes, anthracenes, oxadiazole metal chelates, and porphyrins.

27. An organic light emitting device in accordance with claim 21 wherein the hole transport material is selected from the group consisting of aromatic tertiary amines and indolocarbazole compounds, and the electron transport material is selected from the group consisting of metal oxinoids, triazines, stilbenes, and oxadiazole metal chelates.

28. An organic light emitting device in accordance with claim 27 wherein the hole transport material is selected from the group consisting of N, N-di-1-naphthyl-N,N'-diphenyl-1, 1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and the electron transport material is tris(8-hydroxyquinoline) aluminum or bis(8hydroxyquinolato)-(4-phenylphenolato) aluminum.

29. An organic light emitting device in accordance with claim 1 wherein the second electrode comprises at least one material with work function not more than about 4.5 eV.

30. An organic light emitting device in accordance with claim 1 wherein the second electrode is a cathode possessing a work function not more than about 4.5 eV, and which cathode is selected from the group consisting of Li, Ca, Al, Mg, In, Ag, Mg-Ag alloys, Mg-Al alloys and Al-Li alloys.

31. An organic light emitting device in accordance with claim 1 further containing a thermal protective element formed of a single layer or a plurality of stacked layers laminated in contact to each other.

32. An organic light emitting device in accordance with claim 1 wherein said first electrode is an anode and said second electrode is a cathode.

33. An organic light emitting device consisting essentially of in sequence a substrate;

a first electrode;

a light emitting region comprising an organic luminescent material; and a second electrode, and a thermal protective element, and wherein said thermal protective element is of a thickness of from about 10 nanometers to about 100,000 nanometers, and wherein said thermal protective element is selected from the group consisting of organic compounds, inorganic compounds, metals, metal alloys, and mixtures thereof wherein the thermal expansion coefficient of said protective element is from about $1 \times 10^{-10}$ meter/meter per degree Centigrade to about $9 \times 10^{-6}$ meter/meter per degree Centigrade, and wherein said metal oxide with selected from the group consisting of MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and said metal halide is selected from the group consisting of LiF, KCl, NaCl, CsCl, CsF and KF wherein said metal compound contains a metal selected from the group consisting of Cr, Ti, Si, Ir, Pt, Os, V, Mo, Si, Zr, Ta, W, and Sb; and wherein the metal alloy is selected from the group consisting of Ni, Fe, Cr, Ti, Si, Ir, Pt, Os, V, Mo, Si, Zr, Ta, W, and Sb alloys.

34. An organic light emitting device in accordance with claim 1 comprising in sequence a glass substrate;

a first electrode anode comprised of indium-tin-oxide with thickness of from about 30 to about 300 nanometers;

a light emitting region situated on and in contact with the anode comprising a hole transport material selected from the group consisting of N,N-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and an electron transport material selected from the group consisting of tris(8-hydroxyquinoline) aluminum and bis(8-hydroxyquinolato)-(4-phenylphenolato) aluminum, and wherein the thickness of the light emitting region is from about 10 nanometers to about 300 nanometers; a cathode situated on and in contact with the light emitting region comprised of Al, Mg-Ag or Al-Li alloy of thickness from about 50 nanometers to about 500 nanometers; and a thermal protective layer or layers comprised of SiO, $SiO_2$ or mixtures thereof of a thickness of from about 100 nanometers to about 1,000 nanometers.

35. An organic light emitting device in accordance with claim 34 wherein said thermal protective layer mixture comprises from about 0.1 to about 99.9 weight percent of SiO, and from about 99.9 to about 0.1 weight percent of $SiO_2$, and wherein the total is about 100 percent.

36. An organic light emitting device in accordance with claim 34 wherein the light emitting region includes a layer of a thickness of from about 10 nanometers to about 100 nanometers comprised of a mixture of from about 25 weight percent to about 75 weight percent of the hole transport material, and from about 75 weight percent to about 25 weight percent of the electron transport material.

* * * * *